United States Patent
Watanabe et al.

[11] Patent Number: 5,549,994
[45] Date of Patent: Aug. 27, 1996

[54] EXPOSURE APPARATUS AND REFLECTION TYPE MASK TO BE USED IN THE SAME

[75] Inventors: Yutaka Watanabe, Isehara; Masami Hayashida, Yokohama, both of Japan

[73] Assignee: Canon Kabushiki Kaisha, Tokyo, Japan

[21] Appl. No.: 393,676

[22] Filed: Feb. 24, 1995

[30] Foreign Application Priority Data

Mar. 2, 1994 [JP] Japan .................................. 6-031712

[51] Int. Cl.⁶ ..................................................... G03F 9/00
[52] U.S. Cl. ............................. 430/5; 430/321; 430/322; 378/34; 378/35
[58] Field of Search ............................. 430/5, 321, 322; 378/34, 35

[56] References Cited

U.S. PATENT DOCUMENTS

| | | | |
|---|---|---|---|
| 5,012,500 | 4/1991 | Watanabe et al. | 378/35 |
| 5,052,033 | 9/1991 | Ikeda et al. | 378/35 |
| 5,272,744 | 12/1993 | Itou et al. | 378/35 |
| 5,335,259 | 8/1994 | Hayashida et al. | 378/161 |
| 5,399,448 | 3/1995 | Nagata et al. | 430/5 |

FOREIGN PATENT DOCUMENTS

| | | |
|---|---|---|
| 0279670 | 8/1988 | European Pat. Off. . |
| 5-55120 | 3/1993 | Japan . |

OTHER PUBLICATIONS

A. M. Hawryluk, et al., "Reflection Mask Defect Repair," Applied Optics, vol. 32, No. 34, Dec. 1993, pp. 7012–7015.
Patent Abstracts Of Japan, Kokai No. 4–346–214. vol. 17, No. 203, Apr. 1993.
Patent Abstracts Of Japan, Kokai No. 5–088–355, vol. 17, No. 428, Aug. 1993.

*Primary Examiner*—S. Rosasco
*Attorney, Agent, or Firm*—Fitzpatrick, Cella, Harper & Scinto

[57] ABSTRACT

A reflection type mask includes a reflective portion having a multilayered film, a non-reflective portion having an absorbing material and being formed on the multilayered film, and a non-reflective portion being defined by destroying the multilayered film.

10 Claims, 6 Drawing Sheets

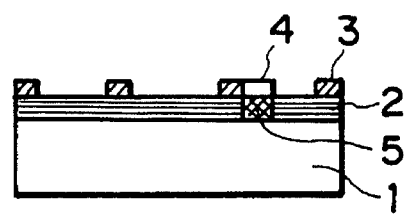
F I G. 1
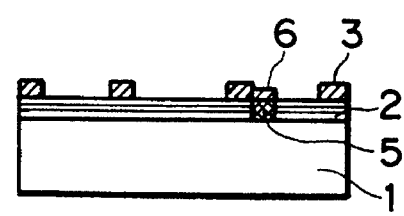
F I G. 2
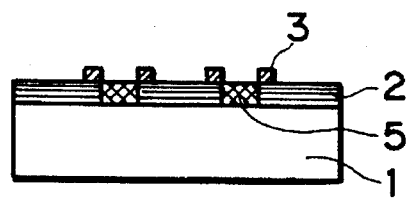
F I G. 3
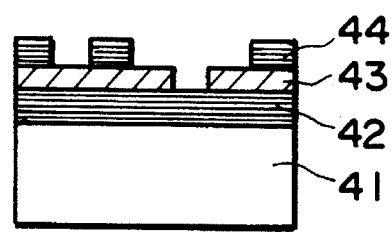
F I G. 4

EXPOSURE APPARATUS AND REFLECTION TYPE MASK TO BE USED IN THE SAME

FIELD OF THE INVENTION AND RELATED ART

This invention relates to an exposure apparatus for irradiating a reflection type mask with X-rays or vacuum ultraviolet rays and for projecting the X-rays or vacuum ultraviolet rays reflected by the reflection type mask onto a resist in a reduced scale. In another aspect, the invention is concerned with a reflection type mask to be used in such an exposure apparatus. In a further aspect, the invention is concerned with a method of manufacturing such a reflection type mask, or a device manufacturing method which uses a reflection type mask or an exposure apparatus using a reflection type mask.

Lithography for optically transferring, to a resist, a fine structure for the manufacture of semiconductor devices, has used exposure apparatuses which use X-rays or vacuum ultraviolet rays having higher resolution in order to meet requirements of a higher degree of integration of a semiconductor device and further miniaturization of it. In such an exposure apparatus, a light source such as a synchrotron or a laser plasma produces X-rays or vacuum ultraviolet rays which are projected to a reflection type mask having a pattern to be transferred. The X-rays or vacuum ultraviolet rays reflected by this reflection type mask are projected in a reduced scale onto a resist applied to a wafer, by means of reflection mirrors. As for a reflection type mask to be used in such an exposure apparatus, there is a mask on which a reflecting portion and a non-reflecting portion are defined by the provision of an absorbing material or a and anti-reflection film on a reflecting mirror in accordance with a pattern to be transferred. As for this reflecting mirror, a multilayered film provided by alternate accumulation of different materials has been used.

For forming a reflecting portion and a non-reflecting portion of a reflection type mask, there are three ways: first, a method of patterning a non-reflective absorbing material on a reflective multilayered film; second, a method of patterning a reflective multilayered film upon a non-reflective substrate; and third, a method of breaking the regularity of a periodic structure of a reflective multilayered film in accordance with a desired pattern shape, to thereby provide a non-reflective portion.

For example, as regards a reflection type mask of FIG. 5 which has a reflective pattern portion 7 and a non-reflective pattern portion 8, the section thereof taken along line A-A' may be one of three shown in FIGS. 6A through 6C.

These figures show three examples of the sectional structure of the reflection type mask, wherein type A shown FIG. 6A corresponds to the first method described above. A multilayered film 2 as a reflective portion is formed on a substrate 1, and an absorbing material 3 as a non-reflective portion is patterned on this multilayered film. This type of structure will be referred to as "Type A".

Type B shown in FIG. 6B corresponds to the second method described above. A multilayered film 9 as a reflective portion is patterned on a substrate 1 (non-reflective portion). This type of structure will be referred to as "Type B".

Type C shown in FIG. 6C corresponds to the third method described above. A multilayered film 10 as a reflective portion is formed on a substrate 1 and, in a portion of this multilayered film, the regularity of periodic structure is broken such that the broken portion provides a non-reflective portion 5 of a desired pattern shape. This type of structure will be referred to as "Type C".

In any type of reflection type mask, in the process of patterning the non-reflective portion or the reflective portion, there is produced an error of correspondence between the formed reflective portion pattern (or non-reflective portion pattern) and a pattern desired: namely, a pattern fault is produced. If an unwanted reflective portion is added as compared with a pattern to be made, it ends in a void fault. If an unwanted non-reflective portion is added, it leads to a solid fault. There may be three causes for such a fault: one is because of a fault of the substrate of a reflection type mask; one is that a fault is produced during a process of forming a reflective multilayered film; and one is that a fault is produced during a process of patterning a reflective or non-reflective portion.

Particularly, as regards the fault produced during the process of patterning a reflective or non-reflective portion, the easiness of repairing the fault depends on the structure or the method of manufacture of the reflection type mask or the type of the fault produced. The easiness/difficulty of repairing a void fault or a solid fault in regard to the three types of reflection type masks is summarized in Table 1, and the meaning of it will be explained below:

TABLE 1

|  | Type A | Type B | Type C |
| --- | --- | --- | --- |
| Solid Fault | xx | xxx | xxx |
| Void Fault | xx | x | x |

FIG. 7 is a plan view for explaining an example of a void fault and a solid fault to be produced during the formation of a desired pattern such as shown in FIG. 5. The section of a mask of type A taken along line 8—8 in FIG. 7 and the section of the mask of type A taken along line 9—9, as viewed in the directions of arrows, respectively, are illustrated in FIGS. 8 and 9, respectively. Void fault 4 in type A results from a lack of an absorbing material (non-reflective material 8) at a necessary portion, while a solid fault 11 results from adhesion of the absorbing material (non-reflective material 8) to an unwanted portion. Thus, a void fault 4 can be repaired by putting an absorbing material (non-reflective material) on it. The absorbing material can be put on a void fault through an electron beam assisted CVD method, for example. However, there is a problem that the pattern shape is affected due to the closing effect of electron beam, this degrading the line width precision. Without using the direct drawing operation such as by the electron beam assisted CVD method, a series of processes including resist coating are required unpreferably. In Table 1, this is indicated by the symbol "xx". A solid fault in type A can be repaired by removing the unwanted absorbing material thereat. Removing an absorbing material at the solid fault can be done by using a convergent ion beam, for example. However, there is a possibility of damaging of a multilayered film (reflective material) underlying the absorbing material. This is indicated in Table 1 also by the symbol "xx".

In types B and C, a void fault results from a presence of a multilayered film (reflective material) at a wanted position and a solid fault results from an absence of a multilayered film (reflective material) at a wanted position. Thus, in type B, a void fault can be repaired by removing the reflective material thereat, and in type C a void fault can be repaired by breaking the regularity of periodic structure of the multilayered film at the position of the fault. Both can be done by using a convergent ion beam, for example. This is indicated in Table 1 by the symbol "x". On the other hand, repairing a solid fault requires additional formation of a reflective material, i.e., a multilayered film structure, at the position of the fault, and it is very difficult. This is indicated in Table 1 by the symbol "xxx".

Japanese Laid-Open Patent Application, Laid-Open No. 55120/1993 shows a method of repairing a solid fault, in a reflection type mask of type B, which results from a failure of formation of a multilayered film reflective pattern at a necessary position. FIG. 4 is a sectional view, illustrating an example of a reflection type mask being repaired in accordance with this method. In this method, a multilayered film 42, a non-reflective material 43 and a multilayered film 44 are accumulated on a substrate 41 sequentially, and thereafter the upper multilayered film 44 is shaped into a desired pattern to form a reflective portion. Then, the upper multilayered film at the solid fault portion is removed together with the non-reflective material, underlying the upper multilayered film, so that the lower multilayered film 42 is uncovered and it serves as the reflective portion of the reflection type mask. The fault is thus repaired. However, this repairing method requires formation of a multilayered film twice, in manufacture of a reflection type mask, and therefore the cost of the reflection type mask increases. Also, the possibility of creation of a fault during the film formation, being one major factor of the fault, increases.

SUMMARY OF THE INVENTION

It is an object of the present invention to provide a novel method of repairing a void fault in a reflection type mask of type A, to thereby improve the yield of reflection type masks.

It is another object of the present invention to provide a reflection type mask, being repaired in accordance with the above method, having a multilayered film not damaged, having a good pattern shape and having a high line width precision.

It is a further object of the present invention to provide a reflection type phase shift mask of unique structure which can be manufactured easily.

In accordance with an aspect of the present invention, there is provided a reflection type mask which comprises a reflective portion being provided by a multilayered film, a non-reflective portion being formed on the multilayered film and being provided by an absorbing material pattern, and a non-reflective portion being provided by breaking the regularity of periodic structure of the multilayered film.

In accordance with another aspect of the present invention, there is provided a method of manufacturing a reflection type mask which comprises forming a multilayered film as a reflective portion upon a substrate, forming an absorbing material pattern as a non-reflective portion upon the multilayered film, and forming a non-reflective portion by breaking the regularity of periodic structure of the multilayered film.

In accordance with a further aspect of the present invention, there is provided a method of manufacturing a reflection type mask which comprises forming a multilayered film as a reflective portion upon a substrate, forming an absorbing material pattern as a non-reflective portion upon the multilayered film, inspecting the absorbing material pattern, and forming, in a case in which an absorbing material is not present at a position where it should be present, a non-reflective portion by destroying the regularity of the periodic structure of the multilayered film at that position.

The method of the present invention may include destroying the regularity of the periodic structure of a multilayered film by using a convergent energy beam, and it may include destroying the regularity of periodic structure of the multilayered film by using an ion shower.

The method of the present invention may include a process of forming, on a multilayered film having its regularity of periodic structure being destroyed an absorbing material having a thickness of a degree not providing a contrast necessary for a reflection type mask.

In accordance with a still further aspect of the present invention, there is provided an exposure apparatus which comprises means for irradiating a reflection type mask having a pattern with an exposure energy, means for projecting the exposure energy being reflected by the reflection type mask onto a wafer, wherein the reflection type mask has a reflective portion being provided by a multilayered film, a non-reflective portion being formed on the multilayered film and being provided by an absorbing material pattern, and a non-reflective portion being provided by destroying the regularity of periodic structure of the multilayered film.

In a reduction exposure apparatus, usually reduction exposure is performed at a reduction ratio of 1:5 to 1:4. Also, a reduction exposure apparatus using soft X-rays or vacuum ultraviolet rays is used for a minimum line width on a wafer of not greater than 0.2 micron. Thus, the minimum line width on a mask is not greater than 1 micron. This means that a fault of a size beyond 1/10 of the minimum line width is a "fault" to be considered.

Fault inspection may be performed in accordance with an optical microscope observation method for comparing a pattern with a pre-examined pattern with no fault, an electron beam scan and comparison method or a laser beam scan method wherein scattered light is examined.

As a void fault repairing method, preferably a method in which a convergent energy beam such as a convergent ion beam or laser beam is projected to a fault portion of a multilayered film to destroy the regularity of the periodic structure of a multilayered film to thereby provide a non-reflective portion, or a method in which a resist pattern being removed is prepared and, by means of an ion shower, for example, the regularity of periodic structure of a multilayered film is destroyed to thereby provide a non-reflective portion, may be used.

As a solid fault repairing method, a convergent energy beam may be used to remove an unwanted excessive absorbing material.

A multilayered film may have a thickness of 50–500 nm, preferably 100–400 nm (further preferably 120–300 nm).

An absorbing material may have a thickness of 30–250, preferably 40–200 nm (further preferably 40–100 nm).

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a sectional view of a reflection type mask according to an embodiment of the present invention.

FIG. 2 is a sectional view of a reflection type mask according to another embodiment of the present invention.

FIG. 3 is a sectional view of a reflection type mask according to a further embodiment of the present invention.

FIG. 4 is a sectional view of a known example of a reflection type mask.

DESCRIPTION OF THE PREFERRED EMBODIMENTS

Figure 5:
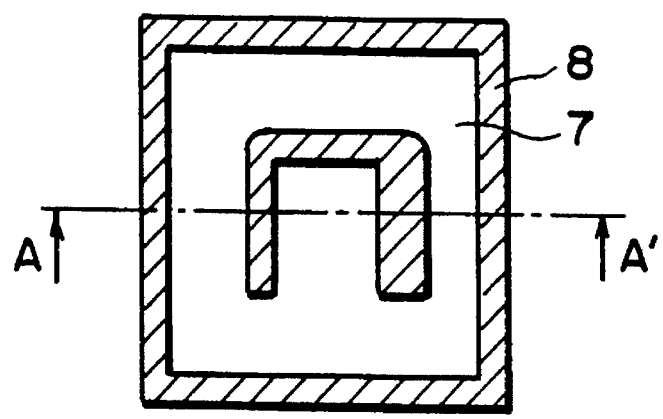
FIG. 5 is a plan view of an example of a reflection type mask having a pattern with a reflective portion and a non-reflective portion.
Figure 6A:
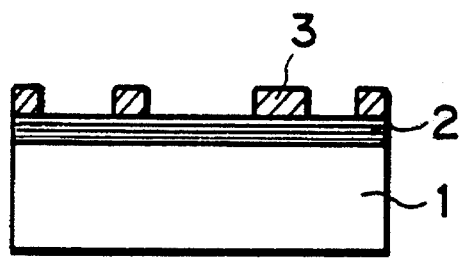
FIGS. 6A through 6C are sectional views illustrating reflection type masks of three layer-structure types corresponding to the pattern shown in FIG. 5.
Figure 6B:
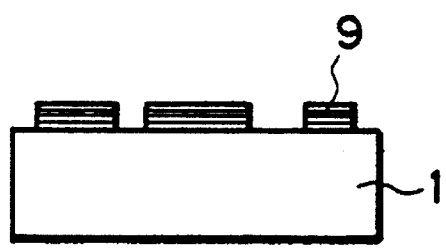
Figure 6C:
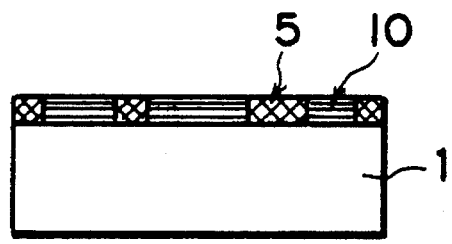
Figure 7:
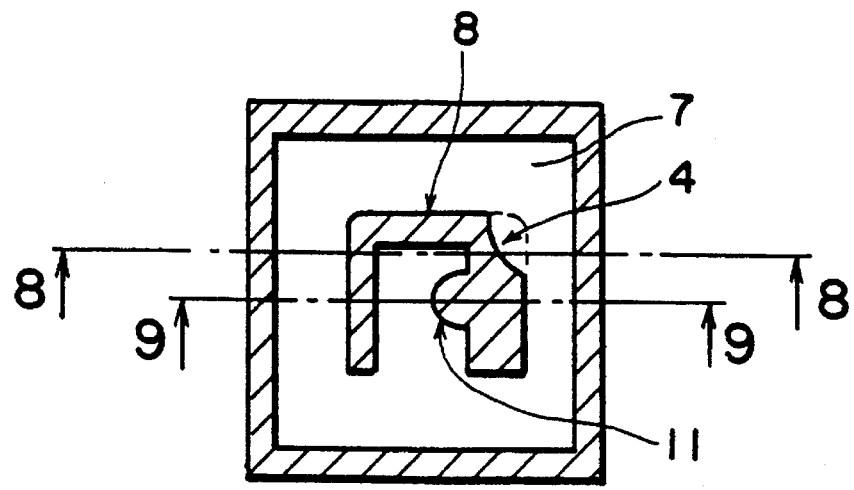
FIG. 7 is a plan view of a reflection type mask having faults in a formed pattern.
Figure 8:
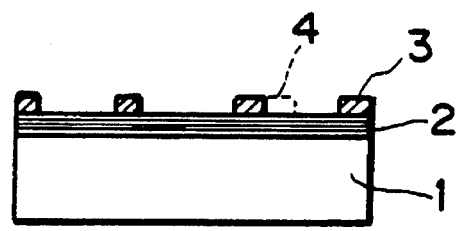
FIG. 8 is a sectional view taken along line 8—8 in FIG. 7.
Figure 9:
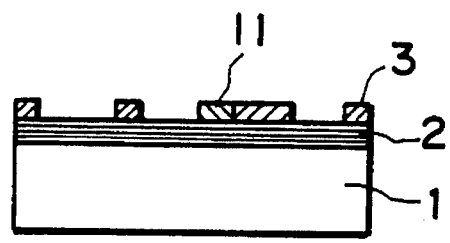
FIG. 9 is a sectional view taken along line 9—9 in FIG. 7.

The present invention will be explained below with reference to some preferred embodiments thereof.

Embodiment 1

FIG. 1 is a sectional view of a reflection type mask according to an embodiment of the present invention. A multilayered film 2 as a reflective portion is formed on a substrate 1, and an absorbing material 3 as a non-reflective portion is formed on the multilayered film. The periodic structure of the multilayered film in a portion 4 of the non-reflective portion where a void fault is present, is broken by using a convergent ion beam to define a non-reflective portion 5 by which the void fault is repaired. An example of a reflection type mask manufacturing method will be explained below.

For use in a soft X-ray reduction projection exposure apparatus using soft X-rays of a wavelength of about 13 nm, a multilayered film 2 which comprises accumulation of forty-one (41) layers of Mo/Si film with a film periodicity of 6.7 nm is formed through RF sputtering upon a Si substrate 1, being polished to a surface roughness not greater than 1 nm (RMS). Then, a layer of W of 50 nm thickness and a layer of $SiO_2$ of 15 nm thickness are accumulated. Subsequently, it is coated with a novolac series positive resist material, and a pattern of a minimum line width of 0.75 micron is printed thereon by using a stepper. Here, the exposure process is performed so that a desired pattern at the non-reflective portion is defined as a resist pattern. Subsequently, the $SiO_2$ material is dry-etched by means of a gas mainly consisting of $CF_4$, and then the W material is dry-etched by means of a gas mainly consisting of $SF_6$. Finally, the remaining resist is removed by using a resist remover, whereby an absorbing material pattern 3 (non-reflective portion) with W (50 nm) and $SiO_2$ (a few nanometers) upon a reflective portion of Mo/Si multilayered film, is provided.

Subsequently, an electron beam scan is performed, and secondary electrons produced thereby are detected. On the basis of a difference in secondary electron emission efficiency between the reflective portion and the non-reflective portion, the placement of the reflective portion pattern and the non-reflective portion pattern being actually formed is measured. Through the comparison of it with the data of a desired pattern being memorized, fault inspection is performed. To any void fault detected, a convergent ion beam is projected to destroy the regularity of periodic structure of the multilayered film in that portion, by which a reflection type mask such as shown in FIG. 1 is produced.

In a case where the depth of penetration of the convergent ion beam or the like is not large enough to sufficiently break the regularity of periodic structure of the multilayered film and elements of the ion beam are deposited on the top layer of the destroyed multilayered film, a method may effectively be adopted in which, as shown in FIG. 2, together with destroying the regularity of periodic structure of the multilayered film, an absorbing material 6 of a thickness not providing by itself a contrast necessary for a reflection type mask is formed to thereby repair the void fault.

While in this embodiment an absorbing material pattern is formed by depositing an absorbing material to the whole surface and thereafter by forming a resist pattern and dry-etching it, the present embodiment may effectively use a "lift-off method" in which an absorbing material pattern is formed after a resist pattern is formed and in which the absorbing material pattern formed on the resist is removed simultaneously with removal of the resist material. Such a lift-off method is preferable because the possibility of damaging of the structure of the multilayered film during the dry-etching process is low.

The substrate may preferably comprise a polished SiC or quartz material. As the multilayered film material of the reflective portion, with a wavelength about 13 nm, preferably a material other than Mo, such as Ru or Rh, for example, may be used alone or in a form of an alloy, in combination with Si. For a wavelength about 5 nm, preferably a material of Cr, Co or Ni, for example, may be used alone or in a form of an alloy, in combination with C.

As regards the absorbing material for the non-reflective portion, preferably a heavy metal material such as Au, Pt or W, for example, other than W, may be used. For manufacture of a half-tone type reflection type mask, as the absorbing material, a metal or semiconductor such as Si, Al or Cr, for example, may preferably be used.

A desired pattern may be formed through a resist exposure process using a stepper as described, and other than this method, but it may be formed through a resist exposure process using an electron beam, vacuum ultraviolet rays or X-rays.

Embodiment 2

Figure 10:
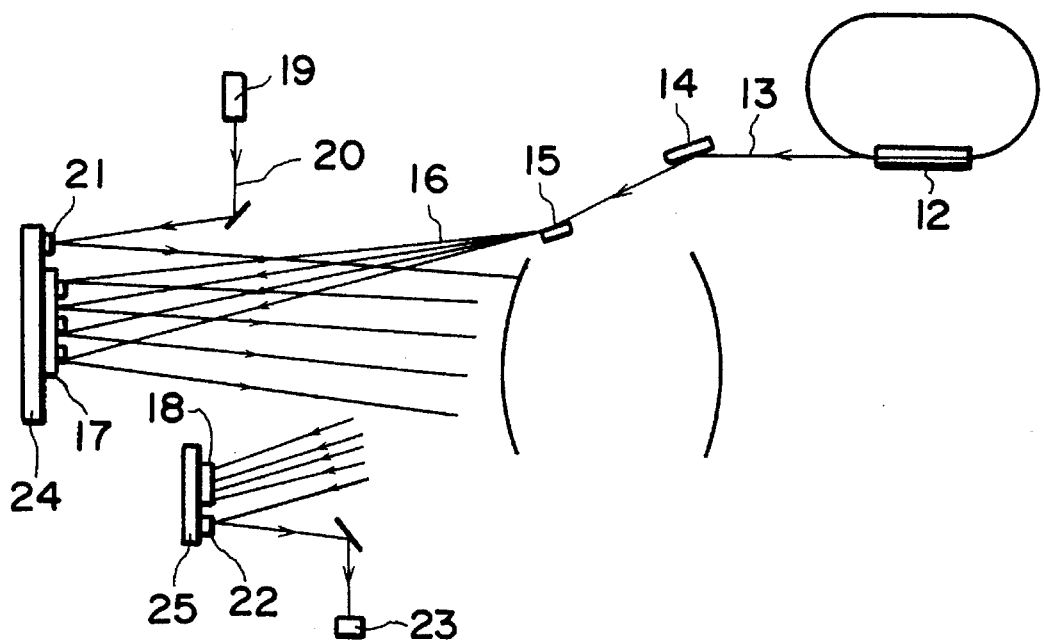
FIG. 10 is a schematic view of an exposure apparatus according to an embodiment of the present invention.
Figure 11:
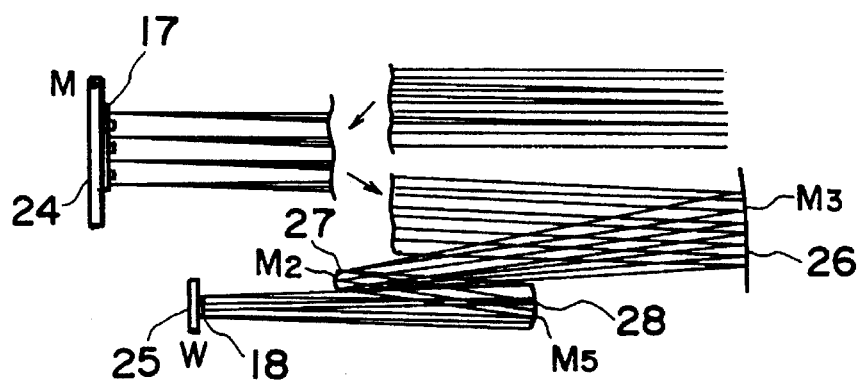
FIG. 11 is a schematic view of an imaging optical system of the exposure apparatus of FIG. 10.

FIG. 10 is a schematic view for explaining the principle of a reduction projection exposure apparatus according to an embodiment of the present invention. FIG. 11 is a schematic view of an imaging optical system of the exposure apparatus of FIG. 10. Soft X-rays or vacuum ultraviolet rays 13 emitted from a soft X-ray source or vacuum ultraviolet ray source 12, go via an illumination optical system which comprises two mirrors 14 and 15, and they are projected on a reflection type mask 17 which is held by a mask stage 24. The mask stage 24 has a reference alignment mark 21 which is to be illuminated with light 20 from a light source 19.

Reflected light from this mark goes through the imaging optical system and it interferes with an alignment mark 22 formed on a wafer stage. The intensity of interference is measured by a detector 23, and on the basis of which the alignment operation of the mask and the wafer is performed. The light source may be a common light source which provides the soft X-rays or vacuum ultraviolet rays. Also, the alignment mark on the mask stage or the wafer stage may be provided by a reflective pattern of a multilayered film to the soft X-rays or vacuum ultraviolet rays. While not shown in the drawings, alignment optical systems are provided to execute alignment of a reference mark of the wafer stage, an alignment mark of a wafer, the reference mark of the mask stage and an alignment mark of a mask.

A reflection type mask of the present invention may have a minimum line width of 0.75 micron and, with a reduction exposure process of 1:5, a resist pattern of minimum line width of 0.15 micron is obtainable. The contrast to a reflective portion differs between a case wherein a non-reflective portion comprises an absorbing material formed upon a reflective portion and a case wherein a non-reflective portion is provided by destroying the regularity of periodic structure of a multilayered film. Usually, a contrast of at least 5 is necessary and, preferably, not less than 10 is necessary. While the non-reflective portion differs in accordance with the absorbing material used and the wavelength of exposure light used, with the materials described with reference to Embodiment 1, a contrast of about 10 is obtainable in conjunction with a thickness of not less than several tens of nanometers. On the other hand, in a case where the regularity of periodic structure of a multilayered film is destruction, while it depends on the degree of destruction, a contrast much higher than that with an absorbing material is obtainable. In a half-tone type reflection type mask, it is necessary that an absorbing material provides a predetermined contrast and additionally that within the absorbing material the phase changes by $\pi$. If, on the other hand, the regularity of periodic structure of the multilayered film is destroyed, this effect is not attainable. The portion in which a fault is repaired loses the function as a phase shift mask of half tone type, but the imaging performance may be improved as compared with a reflection type mask of lower contrast.

Soft X-rays or vacuum ultraviolet rays reflected by the reflective portion of the reflection type mask are projected by means of the imaging optical system (FIG. 11) upon a wafer 18 held by a wafer stage 25, whereby a desired pattern of the reflection type mask is imaged on the wafer in a reduced scale.

Embodiment 3

A phase shift mask can be manufactured by forming an absorbing material (non-reflective portion) on a reflective portion and by destroying the reflective portion to define a non-reflective portion, such as shown in FIG. 3. More specifically, on a multilayered film and around a non-reflective portion provided by breaking the regularity of periodic structure of the multilayered film and having a very low reflectivity (in other words, providing a high contrast), an absorbing material of low contrast and having its phase changed by $\pi$ is formed. This absorbing material serves as a phase shifter.

In the wavelength region of soft X-rays or vacuum ultraviolet rays, the absorption of the absorbing material cannot be decreased to zero even if any material is used. However, by using a suitable material, the phase can be changed by $\pi$ with small absorption. As for such an absorbing material, for a wavelength about 13 nm, a material of Mo, Rh or Ru, for example (which may preferably be used as the material of a multilayered film) may suitably be used alone or in the form of an alloy. Similarly, for a wavelength about 5 nm, a material of Ni, Cr or Co, for example (which may preferably be used as the material of a multilayered film) may suitably be used alone or in the form of an alloy. The multilayered film material and the absorbing material to be provided on the multilayered film may be the same or they may be different from each other. As an example, for 13 nm, a material of Mo, Rh or Ru may be accumulated on a Mo/Si multilayered film. For 5 nm, a material of Cr, Ni or Co may be accumulated on a Cr/C multilayered film. Thus, a single material of or an alloy of Mo, Rh or Ru (wavelength of about 13 nm) or a single material of or an alloy of Ni, Cr or Co (wavelength of about 5 nm) may be accumulated on the reflective portion and around a non-reflective portion defined by destroying the regularity of periodic structure of a multilayered film (reflective portion), to a thickness for changing the phase by $\pi$.

Embodiment 4

Next, an embodiment of a device manufacturing method which uses a reflection type mask or an exposure apparatus such as described hereinbefore, will be explained.

Figure 12:
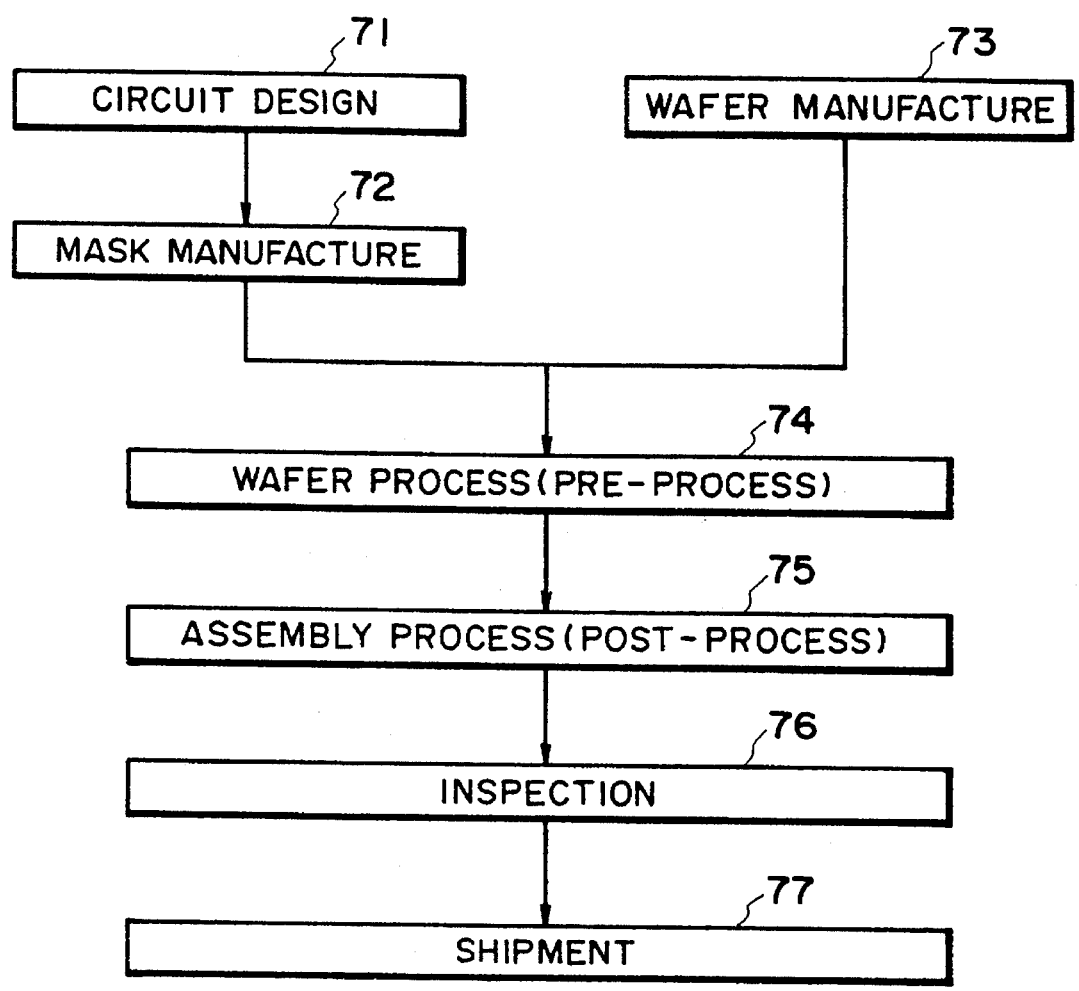
FIG. 12 is a flow chart of semiconductor device manufacturing processes.

FIG. 12 is a flow chart of the sequence of manufacturing a semiconductor device such as a semiconductor chip (e.g. IC or LSI), a liquid crystal panel or a CCD, for example. Step 71 is a design process for designing the circuit of a semiconductor device. Step 72 is a process for manufacturing a mask on the basis of the circuit pattern design. Step 73 is a process for manufacturing a wafer by using a material such as silicon.

Step 74 is a wafer process which is called a pre-process wherein, by using the so prepared mask and wafer, circuits are practically formed on the wafer through lithography. Step 75 subsequent to this is an assembling step which is called a post-process wherein the wafer processed by step 74 is formed into semiconductor chips. This step includes assembling (dicing and bonding) and packaging (chip sealing). Step 76 is an inspection step wherein operability check, durability check and so on of the semiconductor devices produced in step 75 are carried out. With these processes, semiconductor devices are finished and they are shipped (step 77).

Figure 13:
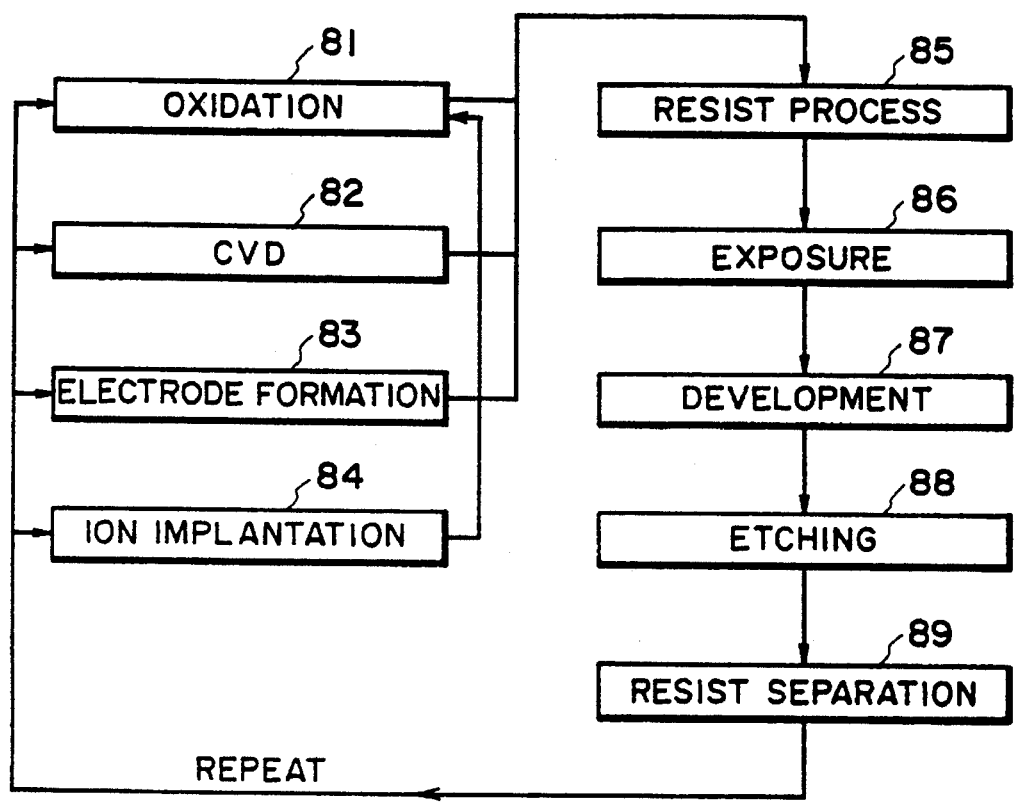
FIG. 13 is a flow chart of details of a waver process.

FIG. 13 is a flow chart showing details of the wafer process. Step 81 is an oxidation process for oxidizing the surface of a wafer. Step 82 is a CVD process for forming an insulating film on the wafer surface. Step 83 is an electrode forming process for forming electrodes on the wafer by vapor deposition. Step 84 is an ion implanting process for implanting ions to the wafer. Step 85 is a resist process for applying a resist (photosensitive material) to the wafer. Step 86 is an exposure process for printing, by exposure, the circuit pattern of the mask on the wafer through the exposure apparatus described above. Step 87 is a developing process for developing the exposed wafer. Step 88 is an etching process for removing portions other than the developed resist image. Step 89 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A reflection mask, comprising:

a reflective portion having a multilayered film;

a non-reflective portion having an absorbing material and being formed on the multilayer film; and a non-reflective portion being defined by destroying the regularity of the periodic structure of the multilayered film.

2. A mask according to claim 1, wherein the non-reflective portion of the absorbing material and the non-reflective portion defined by destroying the multilayered film cooperate to define a pattern to be transferred.

3. A mask according to claim 1, wherein the absorbing material serves as a phase shifter.

4. An exposure apparatus for use with a mask as recited in claim 1, said apparatus comprising:

means for irradiating the mask with exposure energy; and means for projecting a pattern of the mask, being irradiated with the exposure energy, to a wafer.

5. A device manufacturing method for use with a mask as recited in claim 1, said method comprising the steps of:

irradiating the mask with exposure energy; and projecting a pattern of the mask, being irradiated with the exposure energy, to a wafer.

6. A method of manufacturing a reflection mask, comprising:

providing a multilayer film on a substrate to form a reflective portion;

providing an absorbing material pattern on the multilayer film to form a non-reflective portion; and destroying the regularity of the periodic structure of the multilayer film to form a non-reflective portion thereon.

7. A method according to claim 6, further comprising inspecting the absorbing material pattern, and destroying, in a case in which no absorbing material is present at a position where it should be present, a portion of the multilayer film at that position to provide a non-reflective portion.

8. A method according to claim 6, further comprising using a convergent energy beam to destroy the regularity of the periodic structure of the multilayered film.

9. A method according to claim 6, further comprising using an ion shower to destroy the regularity of the periodic structure of the multilayered film.

10. A method according to claim 6, wherein an absorbing material formed close to the portion in which the multilayered film is destroyed serves as a phase shifter.

* * * * *

UNITED STATES PATENT AND TRADEMARK OFFICE
CERTIFICATE OF CORRECTION

PATENT NO. : 5,549,994  Page 1 of 3
DATED : August 27, 1996
INVENTOR(S) : YUTAKA WATANABE, ET AL.

It is certified that error appears in the above-indentified patent and that said Letters Patent is hereby corrected as shown below:

COLUMN 1:

Line 34, "a and" should read --an--;
    Line 53, "shown" should read --shown in--.

COLUMN 2:

Line 48, "of" should read --of the--;
    Line 49, "this" should read --thus--;
    Line 57, "of a" should read --a--.

COLUMN 4:

Line 54, "30-250," should read --30-250nm,--.

COLUMN 6:

Line 32, "aging of" should read --aging--;
    Line 46, "A1" should read --Al--.

UNITED STATES PATENT AND TRADEMARK OFFICE
CERTIFICATE OF CORRECTION

PATENT NO. : 5,549,994
DATED : August 27, 1996
INVENTOR(S) : YUTAKA WATANABE, ET AL.

It is certified that error appears in the above-indentified patent and that said Letters Patent is hereby corrected as shown below:

COLUMN 7:

Line 7, "the" should be deleted;
Line 31, "destruc-" should read --destroyed,--;
Line 32, "tion," should be deleted.

COLUMN 9:

Line 8, "multilayer" should read --multilayered--.

COLUMN 10:

Line 5, "multilayer" should read --multilayered--;
Line 7, "multilayer" should read --multilayered--;
Line 10, "multilayer" should read --multilayered--;

UNITED STATES PATENT AND TRADEMARK OFFICE
CERTIFICATE OF CORRECTION

PATENT NO. : 5,549,994
DATED : August 27, 1996
INVENTOR(S) : YUTAKA WATANABE, ET AL.

It is certified that error appears in the above-indentified patent and that said Letters Patent is hereby corrected as shown below:

COLUMN 10:

Line 14, "multilayer" should read --multilayered--.

Signed and Sealed this

Eighteenth Day of February, 1997

Attest:

BRUCE LEHMAN

Attesting Officer          Commissioner of Patents and Trademarks